United States Patent

Shimizu et al.

[19]

[11] Patent Number: 5,804,422
[45] Date of Patent: Sep. 8, 1998

[54] PROCESS FOR PRODUCING A SEMICONDUCTOR PACKAGE

[75] Inventors: Mitsuharu Shimizu; Toshihisa Yoda, both of Nagano, Japan

[73] Assignee: Shinko Electric Industries Co., Ltd., Nagano, Japan

[21] Appl. No.: 713,551

[22] Filed: Sep. 13, 1996

[30] Foreign Application Priority Data

Sep. 20, 1995 [JP] Japan ..................................... 7-241475
Sep. 20, 1995 [JP] Japan ..................................... 7-241487

[51] Int. Cl.⁶ .................................................... H01L 71/44
[52] U.S. Cl. ........................................... 438/125; 438/111
[58] Field of Search ..................................... 438/111, 121, 438/122, 123, 125

[56] References Cited

U.S. PATENT DOCUMENTS

| | | | |
|---|---|---|---|
| 5,205,036 | 4/1993 | Yamazaki | 438/124 |
| 5,227,583 | 7/1993 | Jones | 438/125 |
| 5,240,588 | 8/1993 | Uchida | 438/125 |
| 5,474,957 | 12/1995 | Urushima | 438/125 |
| 5,702,985 | 12/1997 | Burns | 438/122 |

FOREIGN PATENT DOCUMENTS 62-216250 9/1987 Japan .

*Primary Examiner*—Kevin Picardat
*Attorney, Agent, or Firm*—Pennie & Edmonds LLP

[57] ABSTRACT

A semiconductor package is produced by the following steps. A plurality of circuit boards are prepared, each board having an opening for forming a cavity and a surface providing with a circuit pattern having bonding sections at a peripheral area of the opening. The bonding sections of the respective circuit boards are covered with protective films. A laminated body is formed by laminating the plurality of circuit boards by means of adhesive sheets arranged between the respective circuit boards. Upper and lower substrates are also laminated on upper and lower surfaces of the plurality of circuit boards, respectively, by means of adhesive sheets to close the cavity. The protective films are subsequently removed from the bonding sections of the respective circuit boards of the laminated body.

9 Claims, 8 Drawing Sheets

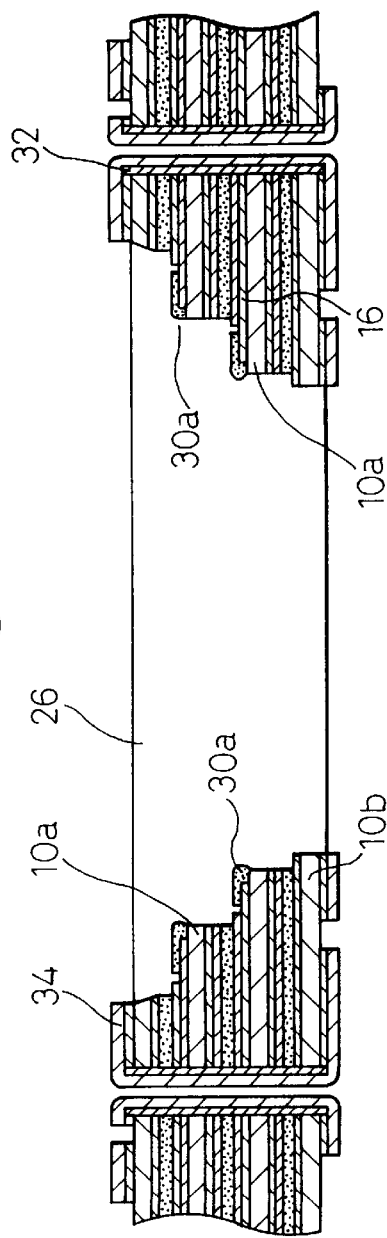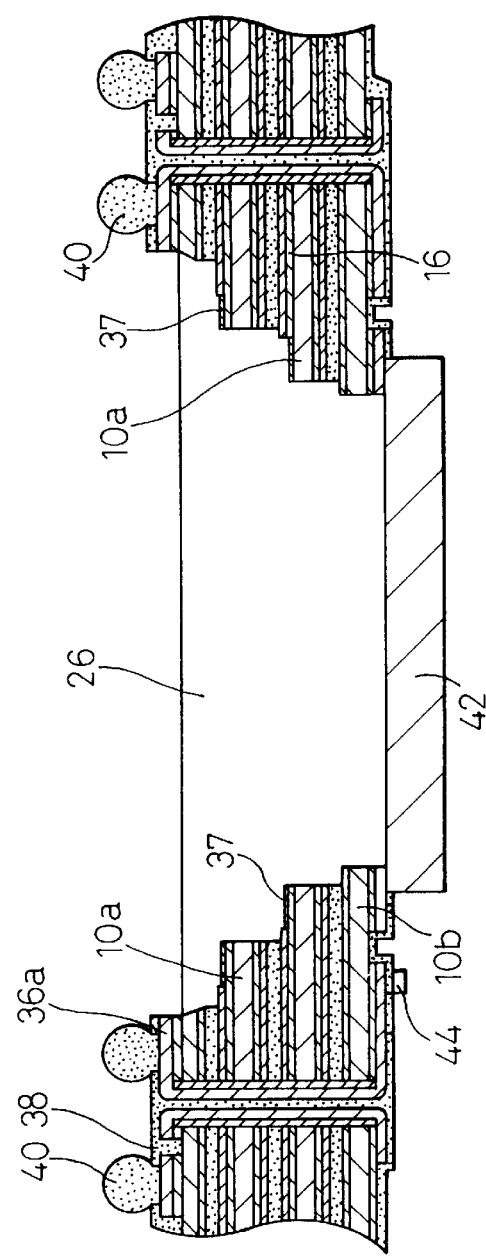

PROCESS FOR PRODUCING A SEMICONDUCTOR PACKAGE

BACKGROUND OF THE INVENTION

1. Field of the Invention

The present invention relates to a process for producing a semiconductor package, particularly one comprised of a plurality of resinous substrates laminated with each other.

2. Description of the Related Art

Semiconductor packages of PPGA (plastic pin-grid array) type, PBGA (plastic ball-grid array) type or others are formed of a multilayer circuit board which is a laminate of electro-insulating substrates such as those formed of glass/epoxy resin, glass/polyimide resin or BT resin, each having a conductor layer such as a copper foil on the surface thereof.

FIGS. 11(a) to 11(d) illustrate a prior art method for producing the multilayer semiconductor package (as disclosed in Japanese Unexamined Patent Publication (Kokai) No. 62-216250). This production method is characterized by the use of substrates for forming a cavity for accommodating a semiconductor element therein and for closing the cavity when the laminate has been completed.

Both the substrate for forming the cavity and the substrate for closing the cavity are formed of the above-mentioned resinous substrate having a conductor layer on the surface thereof. With reference to FIG. 11(a), reference numeral 10a denotes a circuit board for forming the cavity in the interior of the laminate and 10b denotes a substrate for closing the cavity. The circuit board 10a has an opening 12 for forming the cavity and a predetermined circuit pattern provided on the surface thereof by etching the conductor layer. On the other hand, the substrate 10b has neither an opening 12 nor an etched conductor layer.

Reference numeral 14 denotes adhesive sheets for adhering the plurality of circuit boards 10a and substrates 10b with each other to form the laminate for a multilayer circuit board. A prepreg is preferably used as the adhesive sheet, which is a film-like material made of glass fibers impregnated with an adhesive. Each of the adhesive sheets 14 is sandwiched between the circuit boards 10a, 10a or between the circuit board 10a and the substrate 10b, and the assembly is pressed and heated in vacuum to be an integral piece of the laminate (see FIG. 11(b)). The adhesive sheet 14 is preliminarily provided with an opening sized to correspond to the opening 12 in the respective circuit board 10a.

Conventional methods can be adopted for forming a circuit pattern on a resinous substrate with a conductor layer, such as a copper foil, on the respective side thereof, wherein a resist pattern is provided on the conductor layer which is then etched.

After a laminate of the circuit boards has been completed using the adhesive sheets 14, a through-hole 20 is provided by, for example, drilling, for connecting the circuit patterns on the respective layers of the laminate with each other, and an electro-conductive plated layer 22 (such as copper) is formed on the inner wall of the through-hole 20 by electroless plating. After an electroplate (such as a copper plate) has been applied to the plated layer 22 and the conductor layer on the outer surface of the substrates 10b, the conductor layer on the outer surface of the laminate is etched to provide circuit patterns such as lands 24 for the connection with external terminals (see FIG. 11(c)).

Next, the circuit board 10b positioned on the side where the cavity is to have an opening is bored, and then a plated metallic layer, such as nickel or gold, is applied to exposed portions of the circuit patterns 16 in the inner circuit boards 10a. Finally an external terminal 28, such as a solder ball, is bonded to the land 24, resulting in a product (see FIG. 11(d)). Alternatively, a lead pin may be directly inserted into the through-hole to provide an external terminal.

According to the above-mentioned conventional method for producing the semiconductor package, it is possible to isolate the inner circuit boards 10a to be free from the treatments for providing the through-hole 20 and applying an electroless-plated layer thereon because such treatments are carried out on the laminate formed by sandwiching the circuit boards 10a, having openings 12 for forming the cavity, between the substrates 10b having no openings 12, which results in an advantage in that no circuit patterns 16 provided in the circuit boards 10a are damaged by a plating solution used in the above treatment.

However, in the above prior art method, since the adhesive sheets 14 are used for laminating the circuit boards 10a and the substrates 10b with each other, there are problems in that an adhesive is liable to ooze out from the adhesive sheets 14 to contaminate the circuit patterns 16 when the laminate is formed, or glass fibers forming the adhesive sheet 14 together with the adhesive may be separated from the sheet to adhere to a bonding part of the circuit pattern 16.

While the adhesive sheet 14 is, of course, selected so that the amount of oozing-out adhesive is as small as possible when the same is used for the lamination of the circuit boards under pressure and heat, once the adhesive has stuck to the circuit pattern 16, there is a problem in that a predetermined bonding area necessary for performing the function of the circuit pattern 16 cannot be obtained, which is a cause of defective products. To eliminate such drawbacks, a jet scrubbing treatment is proposed in the prior art, wherein after the cavity 26 is opened by boring the substrate 10b, alumina powder is blown to the laminate to remove the unnecessary adhesive.

Even often such countermeasures, however, the adhesive stuck onto the circuit pattern 16 is difficult to remove, and causes a deterioration in reliability for the electric connection in the bonding section, or results in a new problem in that the circuit pattern 16 becomes too narrow by the scrubbing treatment to ensure the predetermined bonding area.

SUMMARY OF THE INVENTION

An object of the present invention is to provide a process for producing a semiconductor package capable of preventing unnecessary adhesive from sticking to a bonding section of a circuit pattern when resinous substrates are bonded with each other while using adhesive sheets to form a laminated circuit board, which ensures a predetermined bonding area in the circuit pattern so that the resultant semiconductor package has a high reliability.

Another object of the present invention is to provide a process for producing a semiconductor package capable of eliminating those drawbacks in the prior art mentioned above.

According to an aspect of the present invention, there is provided a process for producing a semiconductor package, the process comprising the following steps of: preparing a plurality of circuit boards, each having an opening for forming a cavity and a surface providing with a circuit pattern having bonding sections at a peripheral area of the opening; coating the bonding sections of the respective circuit boards with protective films; forming a laminated body by laminating the plurality of circuit boards by means of adhesive sheets arranged between the respective circuit boards so that the cavity is defined by the openings and the bonding sections of the respective circuit boards are exposed in the cavity, and laminating first and second substrates on upper and lower surfaces of the plurality of circuit boards, respectively, by means of adhesive sheets to close the cavity; providing the laminated body with through-holes for connecting the circuit patterns to external terminals and plating the through-holes with conductive metal; forming an opening to at least one of the first and second substrates so that the cavity is opened; and removing the protective films from the bonding sections of the respective circuit boards of the laminated body.

It is desirable that both of the first and second substrates are formed with openings so that the cavity is opened at both of upper and lower surfaces of the laminated body.

It is also desirable that, after the bonding sections of the circuit board are coated by the protective films and the surface of the circuit board is coated with a resist to make the surface flat, the plurality of circuit boards are laminated by means of adhesive sheets arranged between the respective circuit boards.

It is also desirable that the protective films comprise a photoresist.

According to an aspect of the present invention, there is provided a process for producing a semiconductor package, the process comprising the following steps of: preparing a plurality of circuit boards, each having an opening for forming a cavity and a surface providing with a circuit pattern having bonding sections at a peripheral area of the opening; coating the surfaces of the respective circuit boards with photoresist; optically exposing part of the photoresist on the respective circuit board in such a manner that protective films of the photoresist, which can be removed in a subsequent step, are formed on the bonding sections; forming a laminated body by laminating the plurality of circuit boards by means of adhesive sheets arranged between the respective circuit boards so that the cavity is defined by the openings and the bonding sections of the respective circuit boards are exposed in the cavity, and laminating first and second substrates on upper and lower surfaces of the plurality of circuit boards, respectively, by means of adhesive sheets to close the cavity; providing the laminated body with through-holes for connecting the circuit patterns to external terminals and plating the through-holes with conductive metal; forming an opening to at least one of the first and second substrates so that the cavity is opened; and removing the protective films from the bonding sections of the respective circuit boards of the laminated body.

It is desirable that both of the first and second substrate are formed with openings so that the cavity is opened at both of upper and lower surfaces of the laminated body.

A negative type photoresist may be used as the photoresist. Part of the photoresist, except the bonding sections of the circuit pattern, is exposed before the plurality of circuit boards are laminated.

A positive type photoresist may also be used as the photoresist. Part of the photoresist on the bonding sections of the circuit pattern is exposed before the plurality of circuit boards are laminated.

It is also desirable that the protective films are removed from the bonding sections of the respective circuit boards by dissolving the protective films with a solvent.

BRIEF DESCRIPTION OF THE DRAWINGS

The present invention will now be described in more detail with reference to the preferred embodiments illustrated in the attached drawings, wherein FIGS. 1(*a*) through 1(*e*) are illustrations for one embodiment of a process for producing a circuit board for the production of a semiconductor package according to the present invention;

FIG. 6 is a sectional view of the laminate wherein a cavity is opened by boring the substrate;

FIG. 7 is a sectional view of a semiconductor package;

DETAILED DESCRIPTION OF THE EMBODIMENTS

Figure 1A:
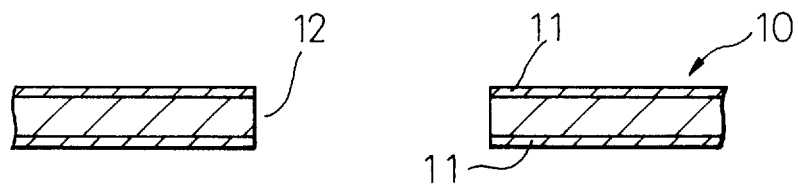
Figure 1B:
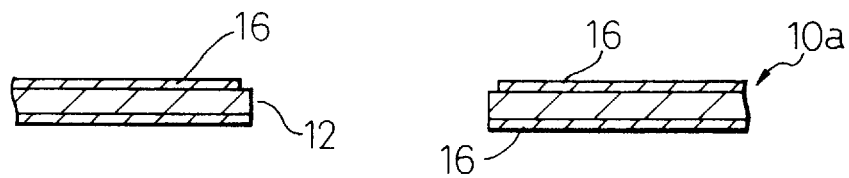

FIGS. 1(*a*) through 1(*e*) illustrate the steps for preparing a laminated circuit board, used for the production of a semiconductor package of a multilayer type, from resinous substrates, each being applied with copper foils as conductor layers on the opposite sides thereof.

FIG. 1(*a*) is a sectional view of a resinous substrate 10 carrying copper foils 11 on the opposite sides thereof. Reference numeral 12 denotes an opening provided in the resinous substrate 10 for forming a cavity. The resinous substrate 10 is made of resinous materials having an electrical insulation property such as glass/epoxy resin, glass/polyimide resin, BT resin or others.

FIG. 1(*b*) illustrates a state wherein after the resinous substrate 10 has been subjected to an etching treatment, a circuit board 10*a* carrying circuit patterns 16 on the opposite sides thereof is formed.

The circuit pattern 16 is prepared by coating a resist on the surface of the copper foil 11, forming a resist pattern by exposing the resist in accordance with a desired pattern, and removing part of the copper foil 11 not covered with the resist by the etching.

A bonding section of the circuit pattern 16 to be connected to a semiconductor element by a wire bonding is formed in the vicinity of the opening 12. The opening 12 in the circuit board 10*a* is preliminarily sized so that an area for the bonding section is ensured in the respective circuit board 10*a* when the circuit boards 10*a* have been laminated with each other to form a laminate. A size of the opening becomes larger as the opening is arranged at a higher position in a cavity 26 when the circuit boards 10*a* are laminated to form the cavity 26.

Figure 1C:
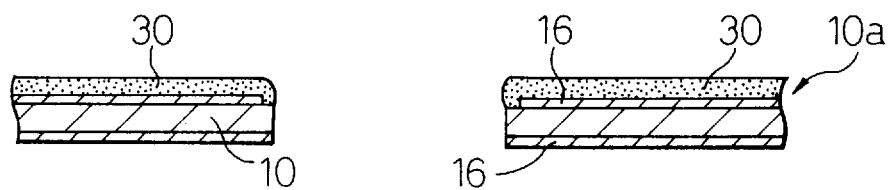
Figure 1D:
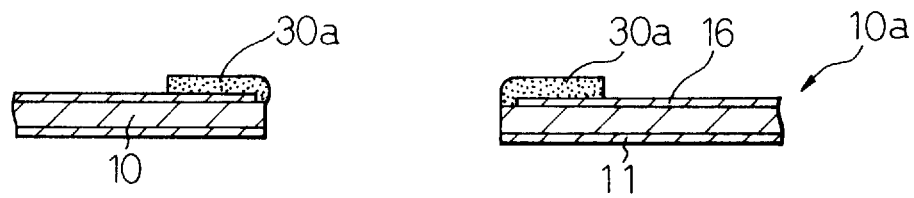

After the circuit pattern 16 has been formed by etching the copper foil 11, a protective covering is formed for protecting the bonding section of the circuit pattern 16. According to this embodiment, the protective covering 30a is formed by coating a photoresist 30 on the upper surface of the circuit board 10a (as seen in FIG. 1(c)) and then dissolving the photoresist 30 to remove part of the circuit pattern 16 other than the bonding section wherein the photoresist has been exposed. FIG. 1(d) illustrates a state wherein the protective covering 30a is formed on the bonding section of the circuit pattern 16.

There is no need for providing the protective covering 30a on the lower surface of the circuit board 10a because the circuit board 10a is adhered to the lower circuit board 10a via an adhesive sheet (prepreg) 14. In this regard, when the circuit pattern 16 is formed, a conductive section may be provided in the inner wall of the opening 12 of the circuit board 10a so that the circuit patterns in the upper and lower surfaces of the circuit board 10a are electrically conductive. In such a case, it is necessary to cover this conductive section in the inner wall of the opening 12 with the protective covering 30a.

The protective covering 30a is to protect the bonding section of the circuit pattern 16 but should be finally removed so that the surface of the circuit pattern 16 is exposed. Accordingly, the photoresist used for this purpose is preferably capable of easily being removed in the later process, for example, by an alkali solution.

Materials for forming the protective covering 30a can be optionally selected provided they can easily be removed by a solvent or the like in a later process.

Figure 1E:
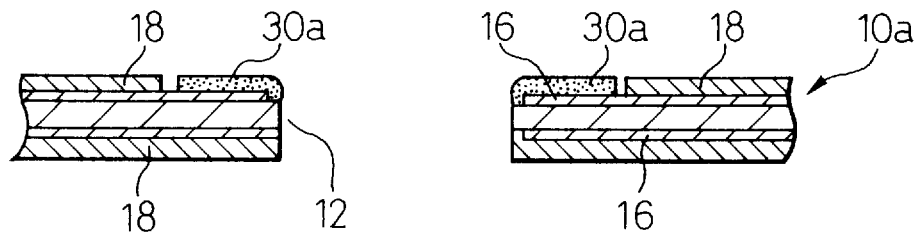

After the bonding section of the circuit pattern 16 has been covered with the protective covering 30a, a resist 18 is coated on the opposite sides of the circuit board 10a so that the respective surfaces of the circuit board 10a become flat (FIG. 1(e)). The resist 18 is coated at a predetermined thickness to correct the irregularity generated on the opposite surfaces of the circuit board 10a due to the provision of the circuit pattern 16. Since the bonding section of the circuit pattern 16 is covered with the protective covering 30a, the resist 18 can be prevented from sticking to the bonding section of the circuit pattern 16 when the resist 18 is applied by a printing method or others. Solder resists or others are preferably used as the resist 18.

The resist 18 is coated in this embodiment for the purpose of flattening the surface of the circuit board 10a to ensure a reliable adhesion between the circuit boards via the adhesive sheet 14.

In this regard, there may be cases wherein no resist 18 is coated before the adhesion of the circuit boards if the material of the adhesive sheet 14 makes this possible. Accordingly, the process for coating the resist on the circuit board 10a is not indispensable.

Figure 2:
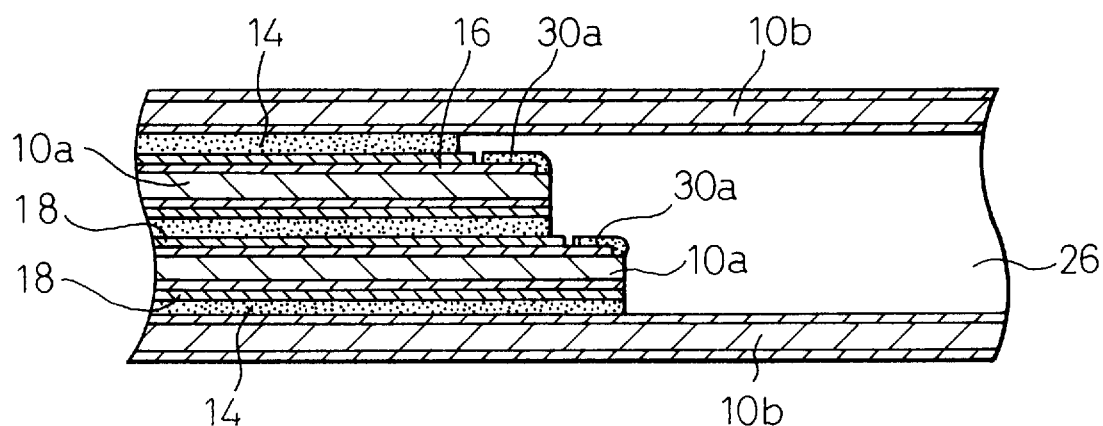
FIG. 2 is a sectional view of a laminate formed of a plurality of substrates bonded to each other.

Then, a laminate is formed by bonding a plurality of circuit boards 10a thus prepared with each other while sandwiching the adhesive sheet 14 between the adjacent circuit boards. FIG. 2 illustrates in a large scale an example of the laminate wherein two circuit boards 10a are bonded with each other. Similarly to the prior art, as shown in FIGS. 11(a) to 11(d), a substrate 10b having no opening 12 is used as the outermost layer when the laminate of circuit boards is formed. That is, two such substrates 10b, 10b sandwich the circuit boards 10a therebetween, so that the cavity 26 is closed.

According to this embodiment, a so-called "prepreg" is used as the adhesive sheet 14. The prepreg is a glass fiber sheet impregnated with an adhesive, which is sandwiched between the circuit boards 10a, 10a or the circuit board 10a and the substrate 10b and heated under pressure in a vacuum chamber for a predetermined period. Thus the adhesive is cured to be fully solidified to result in an integral laminate of the circuit boards.

The protective covering 30a covering the bonding section of the circuit pattern 16 functions to prevent the liquidized adhesive from oozing out of the adhesive sheet 14 and from sticking to the bonding section during the lamination process. Also, debris of the adhesive sheet 14 (such as glass fiber pieces) may be separated during the alignment of the adhesive sheet 14 with the circuit board 10a to fall onto the circuit pattern 16. Even in such a case, it is possible to prevent the bonding section from being contaminated thereby because the bonding section is covered with the protective covering 30a.

Figure 3:
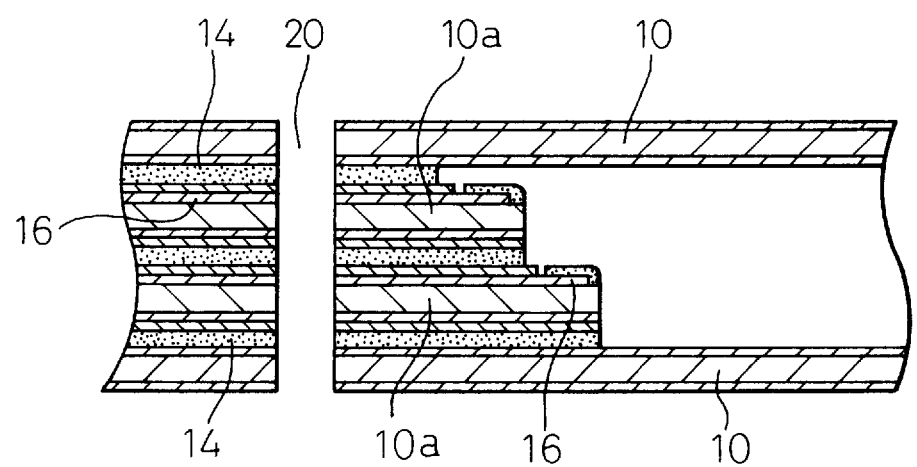
FIG. 3 is a sectional view of the laminate wherein a through-hole is provided therein.
Figure 4:
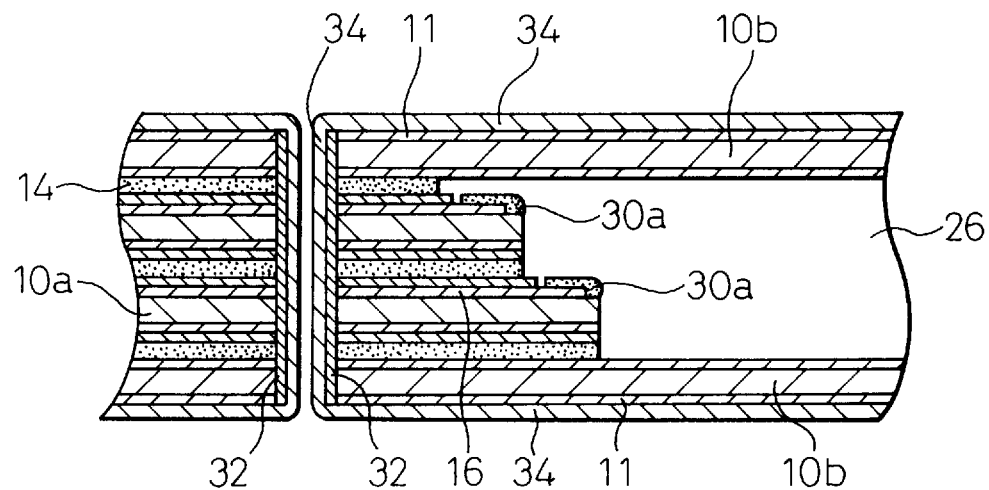
FIG. 4 is a sectional view of the laminate wherein a plating is applied on the through-hole.
Figure 5:
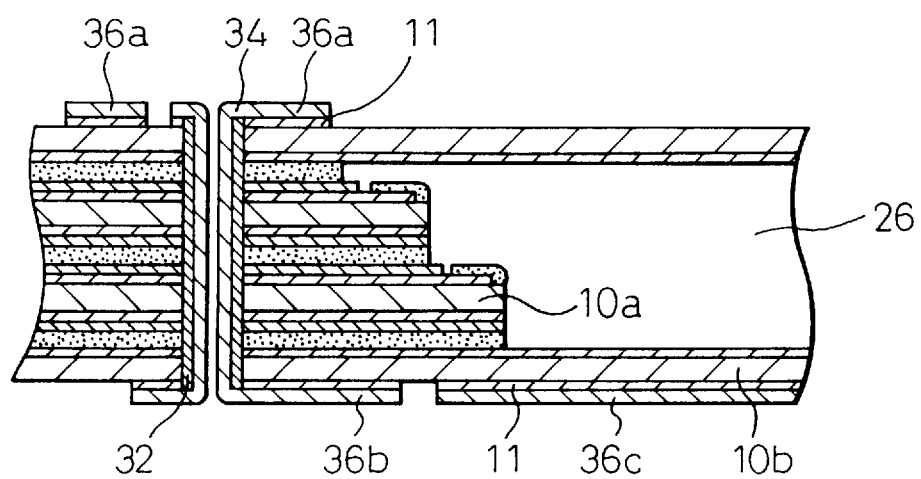
FIG. 5 is a sectional view of the laminate wherein a copper layer formed through an electro-plating and a copper foil are patterned.

FIGS. 3 to 5 illustrate a process for providing in the semiconductor package a connection between the circuit pattern 16 and an external terminal. FIG. 3 illustrates a state wherein a through-hole 20 is provided at a position where the connection is to be formed. The through-hole 20 may be formed by a drill. In this regard, a design of the circuit pattern 16 in the circuit board 10 has been preliminarily selected in accordance with whether or not the electrical connection with the through-hole is necessary.

Next, an electroless plating is applied to the laminate to provide an electroless-plated copper covering 32 on the inner wall of the through-hole 20. However, a part of electroless-plated copper is also attached to the surfaces of the circuit boards 10b, in the same manner as providing an electroplating. Then, an electroplating is applied to provide an electro-plated copper covering 34 on the electroless-plated copper covering 32 and the copper foil 11 on the outer surface of the circuit board 10b. FIG. 4 illustrates a state wherein the electroless plating and the electroplating of copper have been applied.

In this state, the circuit pattern 16 is formed by etching the electroplated copper covering 34 forming the conductor layer on the outer surface of the substrate 10b and the copper foil 11 (see FIG. 5). The circuit pattern to be formed on the outer surface of the substrate 10b includes a land 36a for the connection with an external terminal, a conductive section 36b for the connection of a circuit element such as a condenser or a resistor, or a conductive section 36c for mounting a heat sink.

As described above, the circuit boards 10a in the interior of the laminate are completely protected from the outside during the processes for forming the through-hole 20 in the laminate, for applying the electroless plating and the electroplating of copper, and for forming the circuit pattern by etching the electroplated copper covering 34 and the copper foil 11. Accordingly, there is no risk at all of damaging the circuit pattern 16 on the circuit board 10a due to a plating solution or an etching solution.

After the completion of the circuit pattern including the land 36a or others on the outer surface of the laminate, the substrates 10b, 10b closing the cavity 26 is bored by a router or the like. FIG. 6 illustrates a state wherein the cavity 26 is opened by boring the substrates 10b, 10b.

In this state, a solvent such as an alkali solution is applied to the laminate for removing the protective covering 30a formed on the bonding section of the circuit pattern 16 in the circuit board 10a, whereby the circuit pattern 16 can be exposed for the first time. The protective covering 30a can be easily dissolved by the solvent and removed without adversely influencing the circuit patterns 16 and other conductor sections in the circuit boards 10a. Thus, the circuit pattern 16 can be exposed without narrowing its width to result in an insufficient bonding area, or without the adhesion of foreign matter thereon.

Before the cavity 26 has been bored, a protective layer 38 of a solder resist or the like has been provided on the outer surface of the package. After that, a plated gold layer 37 with nickel ground is applied to the bonding section for the purpose of ensuring the electrical connection between the bonding section and the semiconductor element. This plated gold layer 37 with nickel ground may also be formed in another portion of the circuit pattern such as land 36a connected to the circuit pattern 16.

FIG. 7 illustrates a state wherein external terminals 40, a heat sink 42 and a circuit element 44 are mounted to the laminate after the above process. Thus a semiconductor package of a multilayer type composed of a plurality of circuit boards 10a is obtainable.

In this regard, the substrate 10b defining the bottom wall of the cavity 26 may have a heat sink (a radiator) on the outer surface thereof without being subjected to the boring operation. The heat sink 42 can be attached to the laminate by means of a resin adhesive or a solder. While this embodiment is of a cavity-down type, it is also possible to provide a cavity-up type product wherein the external terminal is bonded to the bottom side of the cavity 26.

While the resinous substrates 10, each carrying the copper foils 11 on both sides thereof are used in the above embodiment, it is also possible to form a semiconductor package in the exactly same steps as above by using resinous substrates, each carrying a copper foil 11 solely on one side thereof. When the resinous substrate carrying the copper foil 11 solely on one side is used, a circuit pattern 16 is formed by etching the copper foil 11 on the one side, and after covering a bonding section of the circuit pattern 16 with a protective covering 30a, a laminate is formed while using adhesive sheets 14 in a similar manner as before.

While a resinous substrate is laminated as the circuit board 10b for closing the cavity 26 with the surface of the circuit board 10a in the above embodiment, it is also possible to bond a resinous substrate or an insulating film on the peripheral edge of the outer opening of the cavity 26, instead of laminating the resinous substrate, to close the cavity 26, and peel off the resinous substrate or the insulating film when desired to open the cavity 26. Accordingly, a substrate for closing the cavity 26 conceptually includes the resinous substrate and the insulating film as described above. Also, the formation of opening for forming the cavity conceptually includes the peel-off of the resinous substrate or film bonded to the peripheral edge of the opening of the cavity 26 for closing the cavity 26.

Figure 8:
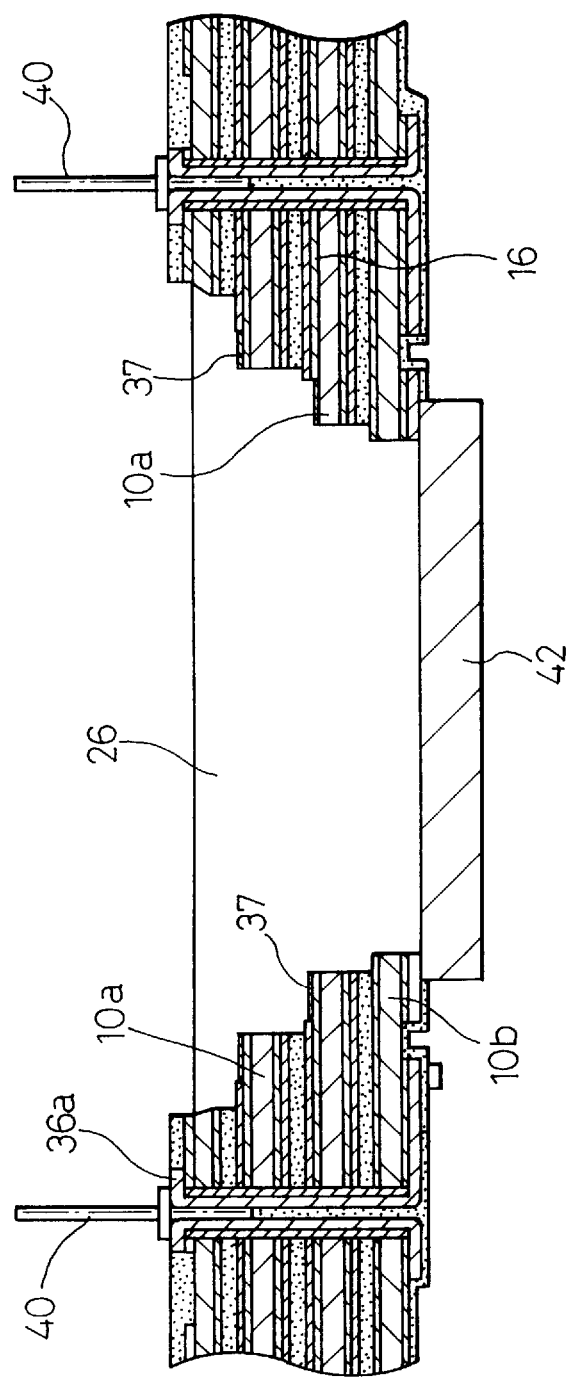
FIG. 8 is a sectional view of another semiconductor package using lead pins as external terminals.

While a solder ball is used as the external terminal 40 in the above embodiment, it is also possible to use a lead pin as the external terminal 40. FIG. 8 illustrates an embodiment wherein the lead pin is used. A hole for receiving the lead pin may be either a full through-hole or a blind hole having a bottom midway through the circuit board.

The above description was made on part of a structure corresponding to a single package for the sake of simplifying the explanation. In practice, a plurality of semiconductor packages are simultaneously produced by using large-sized resinous substrates and then divided into individual packages. Therefore, the patterning of circuit patterns, the coating of resist and the lamination of substrates via adhesive sheets are also carried out on the large-sized substrates.

FIGS. 9(a) to 9(d) illustrate another embodiment of a method for producing a semiconductor package of a multilayer type while using resinous substrates, each carrying copper foils as conductor layers on the opposite sides thereof.

Figure 9A:
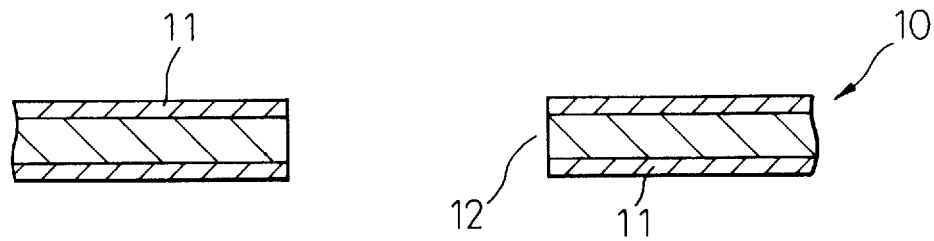
FIGS. 9(*a*) through 9(*d*) are illustrations for another embodiment of a process for producing a circuit board for the production of a semiconductor package according to the present invention.

FIG. 9(a) is a sectional view of a resinous substrate 10 carrying copper foils 11 on the opposite sides thereof. Reference numeral 12 denotes an opening provided in the resinous substrate 10 for forming a cavity. The resinous substrate 10 is basically made of electro-insulating resinous material such as glass/epoxy resin, glass/polyamide resin or BT resin, in the same manner as the above embodiment.

Figure 9B:
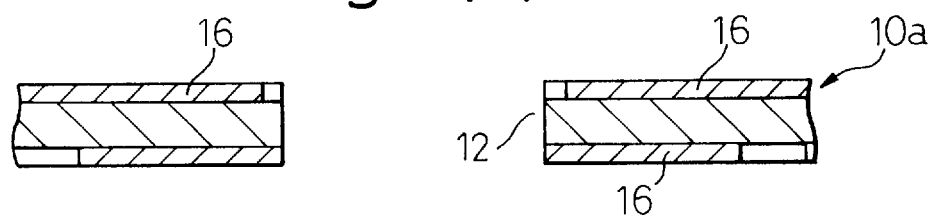

FIG. 9(b) illustrates a state wherein circuit patterns 16 are formed on the opposite sides of the resinous substrate 10 by the application of etching treatment on the resinous substrate 10. Specifically, the circuit pattern 16 is formed by coating a resist on the copper foil 11, forming a resist pattern by exposing the resist in accordance with a desired pattern, and removing part of copper foil 11 other than that covered with the resist.

A bonding section of the circuit pattern 16 to be connected to the semiconductor element by wire bonding is formed in the vicinity of the peripheral edge of the opening 12. The opening 12 of the respective circuit board 10a is preliminarily sized so that, when a laminate is formed by laminating a plurality of circuit boards 10a, an area for the bonding section is ensured.

Figure 9C:
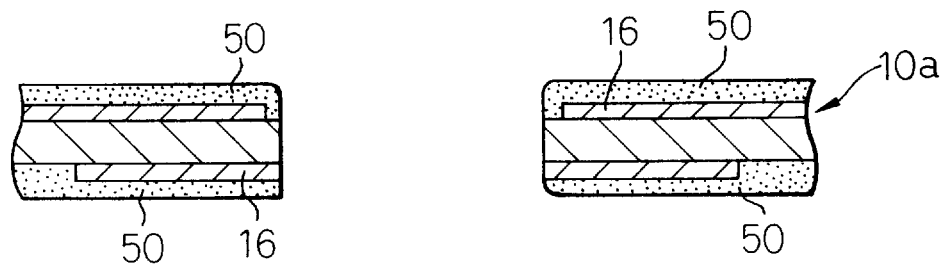

After the circuit pattern 16 has been formed by etching the copper foil 11, a photoresist 50 is coated on the surface of the circuit board 10a carrying the circuit pattern 16 (see FIG. 9(c)).

Figure 9D:
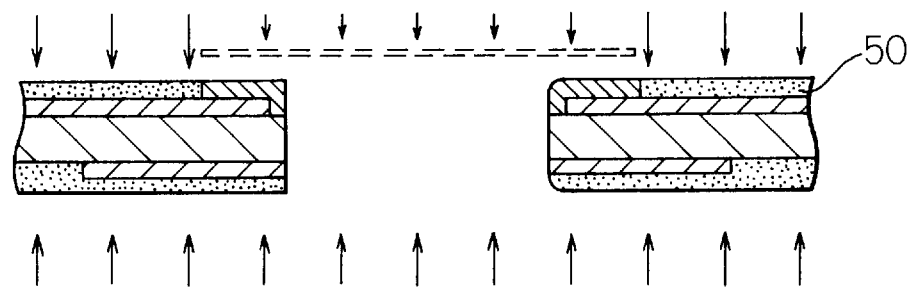

According to this embodiment, a negative type photoresist is used as the photoresist 50. FIG. 9(d) illustrates a state wherein part of the photoresist 50 coated on the circuit board 10a is exposed. The exposed part of the photoresist 50 of a negative type is left as it is even after development but the non-exposed part is dissolved during development and removed.

In this exposure process, an area corresponding to the circuit pattern 16 other than the bonding section, i.e., an area to be overlapped with other circuit board, is exposed for the purpose of leaving the photoresist 50 on a portion to be adhered to the circuit board 10a while removing the photoresist 50 covering the bonding section in a later process.

The photoresist 50 is used for covering the bonding section of the circuit pattern 16 as well as for correcting the irregularity on the surface of the circuit board 10a including the circuit pattern 16, created due to the formation of the circuit pattern 16, to flatten the surface of the circuit board 10a. Specifically, the irregularity on the surface of the circuit board 10a due to the formation of the circuit pattern 16 can be flattened by coating the photoresist 50 at a predetermined thickness, whereby the circuit boards 10a can be assuredly bonded to each other while sandwiching the adhesive sheet (prepreg) 14.

According to this embodiment, the circuit patterns 16 are provided on the upper and lower surfaces, respectively, of the circuit board 10a, and the lower surface is wholly exposed for the purpose of leaving the photoresist 50 coated thereon as it is. In this regard, if a conductive section is provided in the inner wall of the opening 12 for electrically connecting the circuit patterns 16 provided on the upper and lower surfaces with each other, the conductive section in the inner wall of the opening 12 is also coated with the photoresist 50. However, the photoresist 50 in the inner wall of the opening 12 is not exposed to a light beam so that it can be removed from the conductive section in a later process.

While the circuit board 10a is formed from a resinous substrate 10 carrying copper foils 11 on the opposite surfaces thereof, it is also possible to form a circuit board 10a from a resinous substrate carrying a copper foil 11 solely on one surface thereof. In such a case, the photoresist 50 is coated on the surface carrying the circuit pattern, which then is subjected to an exposure treatment in a similar manner as before. In this regard, the photoresist 50 is not necessarily coated on the other surface of the circuit board 10a, but may be coated thereon to facilitate the adhesion between the circuit boards 10a by the adhesive sheet 14.

Figure 10:
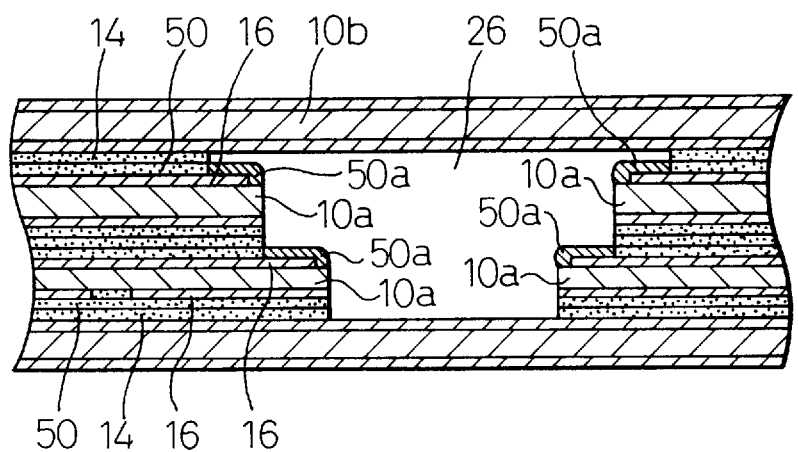
FIG. 10 is a sectional view of another laminate formed of a plurality of circuit boards bonded to each other.
Figure 11A:
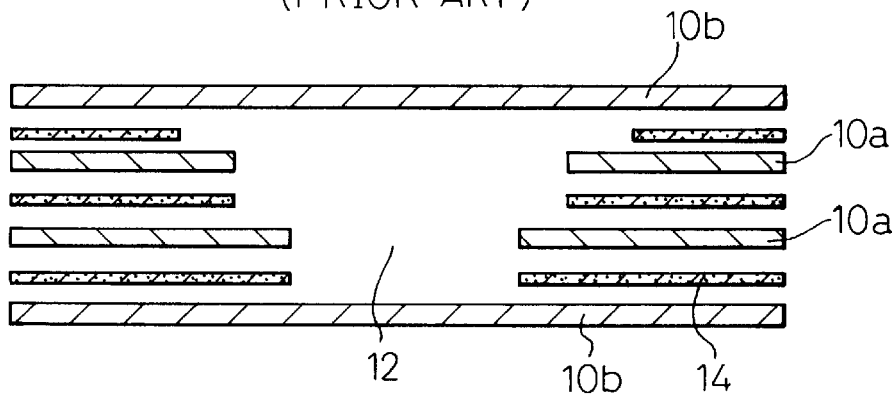
FIGS. 11(*a*) through 11(*d*) are illustrations for the conventional process for producing a semiconductor package of a multilayer type.
Figure 11B:
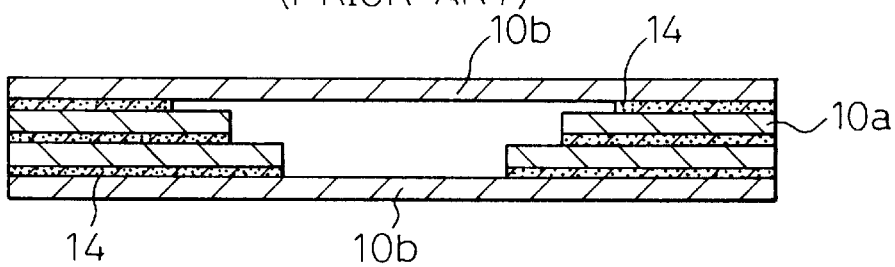
Figure 11C:
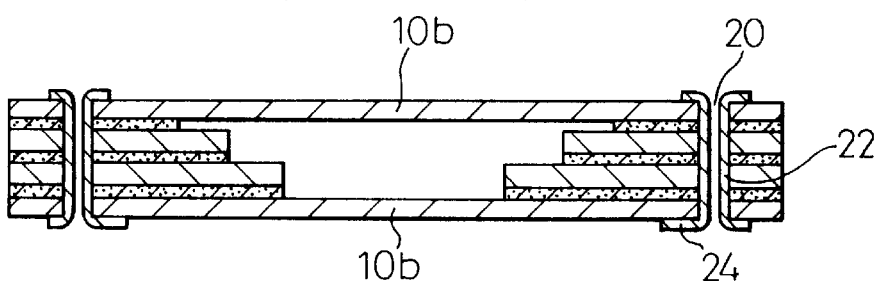
Figure 11D:
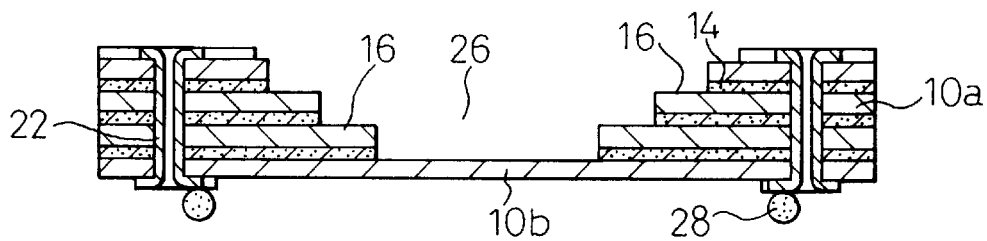

FIG. 10 illustrates a state wherein a laminate is formed by laminating the circuit boards 10a while sandwiching the adhesive sheet 14 between the adjacent boards. Substrates 10b, 10b having no openings 12 for forming the cavity are bonded to the upper and lower outer surfaces of an assembly of the circuit boards 10a, respectively, via the adhesive sheets 14. A cavity 26 defined by the openings 12 of the laminated circuit boards 10a is closed by the substrates 10b, 10b.

In this embodiment, a so-called prepreg is also used as the adhesive sheet 14, in the same manner as the above embodiment.

The bonding section at a tip end of the circuit pattern 16 is coated with a protective covering 50a of the photoresist 50.

Since the photoresist 50 covers all the surface of the circuit board 10a including the bonding section, it is possible to assuredly prevent the bonding section of the circuit pattern 16 from being contaminated by the adhesive which might ooze out from the hot-pressed adhesive sheet 14 during the lamination of the circuit boards 10a, 10a or the lamination of the circuit board 10a and the substrate 10b.

Also, even though debris from the adhesive sheet 14 (such as glass fiber piece) falls onto the circuit board when the adhesive sheet 14 is aligned to the circuit board 10a, the bonding section is not contaminated thereby.

Then, a through-hole 20 is bored and the through-hole is plated with copper in the same manner as the above embodiment.

The bonding section of the circuit pattern 16 of the circuit board 10a is covered with a protective covering 50a of the photoresist 50 when the substrates 10b, 10b are bored. The protective covering 50a is not subjected to the exposure treatment, is and easily removable by a solvent such as an alkali solution.

Since the protective covering 50a can be dissolved and removed by the solvent without adversely influencing conductor portions of the circuit board 10a including the circuit pattern 16 or the like, it is possible to expose the bonding section of the circuit pattern 16 while being free from an inconvenience in that the width thereof is narrowed to result in an insufficient bonding area or foreign matters stick thereon.

The photoresist 50 used in the above embodiment serves to protect the circuit pattern 16, particularly the bonding section thereof, when the circuit boards 10a, 10a are laminated or the substrate 10b is bored. As described in the production process therefor, the protective covering 50a is dissolved and removed by the solvent after the cavity 26 is opened. Therefore, any materials can be used as the photoresist 50, provided it could be easily removed in a later process.

For example, a positive type resist may be used for this purpose alternative to the negative type resist used in the above embodiment.

Since an exposed portion of the positive type photoresist is dissolved and removed in the developing treatment, the exposure is carried out solely in the bonding section of the circuit pattern 16, i.e., in a range wherein the resist is to be dissolved and removed in a later process. Processes succeeding thereto are similar to those when the negative type photoresist is used.

After the substrate 10b has been bored to open the cavity 26, the protective covering 50a in the bonding section is dissolved and removed. That is, since an area of the photoresist corresponding to the bonding section has been preliminarily exposed by a light beam, the exposed area is dissolved and removed.

In this regard, when the positive type photoresist is used, it is also possible to adopt the following steps of; laminating the circuit boards 10a coated on the surface thereof with the photoresist without the exposure treatment, applying a predetermined plating, boring the substrate 10b to open the cavity 26, carrying out the exposure treatment in an area corresponding to the bonding section of the circuit pattern 16, and dissolving and removing the exposed area of the photoresist.

As described with reference to the above embodiments, according to the methods wherein the circuit pattern 16 is covered and protected with the photoresist, a stable surface property is obtained in the circuit pattern after the photoresist has been removed from the bonding section of the circuit pattern 16, which facilitates the stability of nickel plating or gold plating.

In the second embodiment, during the process in which the protective covering 50a is formed, the process of flattening the surface of the circuit board 10a can simultaneously performed. Therefore, the second embodiment can more simply be conducted than the first embodiment in which the process of forming the protective coating 30a and the process of flattening the surface of the circuit board 10a, i.e., the process of forming the resist 18, have to separately be conducted.

It should be understood by those skilled in the art that the foregoing description relates to only some preferred embodiments of the disclosed invention, and that various changes and modifications may be made to the invention without departing from the spirit and scope thereof.

We claim:

1. A process for producing a semiconductor package, said process comprising the following steps of:

preparing a plurality of circuit boards, each having an opening for forming a cavity and a surface providing with a circuit pattern having bonding sections at a peripheral area of said opening;

coating said bonding sections of the respective circuit boards with protective films;

forming a laminated body by laminating said plurality of circuit boards by means of adhesive sheets arranged between said respective circuit boards so that said cavity is defined by said openings and said bonding sections of the respective circuit boards are exposed in said cavity, and laminating first and second substrates on upper and lower surfaces of said plurality of circuit boards, respectively, by means of adhesive sheets to close said cavity;

providing said laminated body with through-holes for connecting said circuit patterns to external terminals and plating said through-holes with conductive metal;

forming an opening to at least one of said first and second substrates so that said cavity is opened; and removing said protective films from said bonding sections of the respective circuit boards of the laminated body.

2. A process as set forth in claim 1, wherein both of said first and second substrate are formed with openings so that said cavity is opened at both of upper and lower surfaces of said laminated body.

3. A process as set forth in claim 1, wherein after said bonding sections of the circuit board is coated by said protective films and said surface of the circuit board is coated with a resist to make said surface flat, said plurality of circuit boards are laminated by means of adhesive sheets arranged between said respective circuit boards.

4. A process as set forth in claim 1, wherein said protective films comprise a photoresist.

5. A process for producing a semiconductor package, said process comprising the following steps of:

preparing a plurality of circuit boards, each having an opening for forming a cavity and a surface providing with a circuit pattern having bonding sections at a peripheral area of said opening;

coating said surfaces of the respective circuit boards with photoresist;

optically exposing part of said photoresist on the respective circuit board in such a manner that protective films of said photoresist, which can be removed in a subsequent step, are formed on said bonding sections;

forming a laminated body by laminating said plurality of circuit boards by means of adhesive sheets arranged between said respective circuit boards so that said cavity is defined by said openings and said bonding sections of the respective circuit boards are exposed in said cavity, and laminating first and second substrates on upper and lower surfaces of said plurality of circuit boards, respectively, by means of adhesive sheets to close said cavity;

providing said laminated body with through-holes for connecting said circuit patterns to external terminals and plating said through-holes with conductive metal;

forming an opening to at least one of said first and second substrates so that said cavity is opened; and removing said protective films from said bonding sections of the respective circuit boards of the laminated body.

6. A process as set forth in claim 5, wherein both of said first and second substrate are formed with openings so that said cavity is opened at both of upper and lower surfaces of said laminated body.

7. A process as set forth in claim 5, wherein a negative type photoresist is used as said photoresist and part of said photoresist except on said bonding sections of the circuit pattern are exposed, before said plurality of circuit boards are laminated.

8. A process as set forth in claim 5, wherein a positive type photoresist is used as said photoresist and part of said photoresist on said bonding sections of the circuit pattern are exposed, before said plurality of circuit boards are laminated.

9. A process as set forth in claim 5, wherein said protective films are removed from said bonding sections of the respective circuit boards by dissolving said protective films with a solvent.

* * * * *